United States Patent
Hyun et al.

(10) Patent No.: US 8,415,224 B2
(45) Date of Patent: Apr. 9, 2013

(54) METHOD OF FABRICATING A SEMICONDUCTOR DEVICE INCLUDING FORMING TRENCHES HAVING PARTICULAR STRUCTURES

(75) Inventors: Sung-Woo Hyun, Seoul (KR); Yu-Gyun Shin, Seongnam-si (KR); Sun-Ghil Lee, Hwaseong-si (KR); Hong-Sik Yoon, Seongnam-si (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 72 days.

(21) Appl. No.: 13/184,318

(22) Filed: Jul. 15, 2011

(65) Prior Publication Data

US 2012/0049285 A1    Mar. 1, 2012

(30) Foreign Application Priority Data

Aug. 25, 2010 (KR) .................. 10-2010-0082478

(51) Int. Cl.
  *H01L 21/331* (2006.01)
  *H01L 21/76* (2006.01)

(52) U.S. Cl.
  USPC ........... 438/337; 438/360; 438/361; 438/427; 438/429; 438/430; 438/561; 438/700; 438/702

(58) Field of Classification Search .............. 438/44, 438/337, 360, 361, 427, 429, 430, 561, 700, 438/702; 257/E21.548, E21.549, E21.585
See application file for complete search history.

(56) References Cited

U.S. PATENT DOCUMENTS

| 6,639,296 | B2 * | 10/2003 | Koido et al. | 257/510 |
| 6,995,095 | B2 * | 2/2006 | Yu | 438/750 |
| 7,179,717 | B2 * | 2/2007 | Sandhu et al. | 438/424 |
| 7,211,498 | B2 * | 5/2007 | Kim | 438/427 |
| 7,601,609 | B2 * | 10/2009 | Lee | 438/424 |
| 7,902,035 | B2 * | 3/2011 | Yu et al. | 438/424 |
| 2002/0137306 | A1 * | 9/2002 | Chen | 438/430 |
| 2009/0280612 | A1 * | 11/2009 | Shimamune et al. | 438/300 |
| 2010/0230758 | A1 * | 9/2010 | Chang et al. | 257/368 |
| 2011/0062494 | A1 * | 3/2011 | Engelmann et al. | 257/192 |
| 2012/0217612 | A1 * | 8/2012 | Baars et al. | 257/508 |

FOREIGN PATENT DOCUMENTS

| JP | 2007-036205 | 2/2007 |
| JP | 2009-010111 | 1/2009 |
| KR | 10-20080041588 A | 5/2008 |

* cited by examiner

*Primary Examiner* — Ngan Ngo
(74) *Attorney, Agent, or Firm* — Muir Patent Consulting, PLLC

(57) ABSTRACT

A method of fabricating a semiconductor device and a semiconductor device are provided. The method includes method of fabricating a semiconductor device including providing a semiconductor substrate having a first semiconductor device region and a second semiconductor device region defined therein, forming a first gate structure in the first semiconductor device region, forming a second gate structure in the second semiconductor device region, forming a first trench adjacent to a first side of the first gate structure, forming a second trench adjacent to a first side of the second gate structure, and forming a first semiconductor pattern in the first trench and forming a second semiconductor pattern in the second trench, wherein the first and second trenches have different cross-sectional shapes from each other.

16 Claims, 13 Drawing Sheets

METHOD OF FABRICATING A SEMICONDUCTOR DEVICE INCLUDING FORMING TRENCHES HAVING PARTICULAR STRUCTURES

CROSS-REFERENCE TO RELATED APPLICATION

This application claims priority under 35 USC §119 to Korean Patent Application No. 10-2010-0082478, filed on Aug. 25, 2010 in the Korean Intellectual Property Office, the contents of which in its entirety are herein incorporated by reference.

BACKGROUND OF THE INVENTION

1. Field of the Invention

The present invention relates to a semiconductor device and a method of fabricating the same.

2. Description of the Related Art

The past few decades have witnessed numerous achievements and economically advantageous effects owing to the semiconductor technology scaling. For example, scaling down design rules of a metal oxide semiconductor field effect transistor (MOSFET) enabled a reduced channel length and an increased switching speed. This is because the switching speed becomes faster as the channel length is shorter. However, a short channel length may undesirably result in a short-channel effect, particularly in a p-type device. Therefore, the scaling down of design rules has limitations. The short-channel effect may include, but is not limited to, a change in the threshold voltage (to be abbreviated to TV, hereinafter), excessive drain leakage current, punch through, and drain induced barrier lowering (DIBL).

In addition to the short-channel effect, when semiconductor device regions performing different functions are integrated on a single semiconductor substrate, loading of epitaxial semiconductor layers formed on the respective semiconductor device regions becomes different, so that the epitaxial semiconductor layers formed on the semiconductor substrate may have different heights.

SUMMARY OF THE INVENTION

Some example embodiments provide a method of fabricating a semiconductor device which can overcome a short-channel effect and a load problem of an epitaxial semiconductor layer.

The above and other objects of the present disclosure will be described in or be apparent from the following description of the various embodiments.

According to one embodiment, there is provided a method of fabricating a semiconductor device, including providing a semiconductor substrate having a first semiconductor device region and a second semiconductor device region defined therein and including a bottom surface and a top surface, forming a first gate structure in the first semiconductor device region, forming a second gate structure in the second semiconductor device region, the second gate structure spaced apart from the first gate structure in a first direction, the first direction perpendicular to a second direction extending between the top surface and bottom surface, forming a first trench adjacent to a first side of the first gate structure in the first direction, forming a second trench adjacent to a first side of the second gate structure in the first direction, and forming a first semiconductor pattern in the first trench and forming a second semiconductor pattern in the second trench, wherein the first and second trenches have different cross-sectional shapes from each other, when viewed from a third direction perpendicular to the first and second directions.

In further embodiment, there is provided a method of fabricating a semiconductor device, including providing a semiconductor substrate having a first semiconductor device region and a second semiconductor device region defined therein, forming a first gate structure in the first semiconductor device region, forming a second gate structure in the second semiconductor device region, forming a first trench adjacent to a first side of the first gate structure in a first direction, forming a second trench adjacent to a first side of the second gate structure in the first direction, the second trench having a recess region overlapping with the second gate structure in the first direction, and forming a first semiconductor pattern in the first trench and forming a second semiconductor pattern in the second trench.

In another embodiment, there is provided a semiconductor device including a substrate, a first region and a second region. The first region includes a first trench, a first epitaxial layer including a first source/drain having a first part and a second part, the first part extending from a top surface of the substrate to a top surface of the first source/drain, and the second part extending from the top surface of the substrate to a bottom surface of the first source/drain in the first trench, and a first gate electrode disposed adjacent to the first source/drain in a first direction and disposed on the substrate. The second region includes a second trench, a second epitaxial layer including a second source/drain having a first part and a second part, the first part extending from the top surface of the substrate to a top surface of the second source/drain and the second part extending from the top surface of the substrate to a bottom surface of the second source/drain in the second trench, and a second gate electrode disposed adjacent to the second source/drain in the first direction and disposed on the substrate. The cross-sectional shape of the first part of the first source/drain is the same as the cross-sectional shape of the first part of the second source/drain. The cross-sectional shape of the second part of the first source/drain is different from the cross-sectional shape of the second part of the second source/drain.

BRIEF DESCRIPTION OF THE DRAWINGS

The above and other features and advantages disclosed herein will become more apparent by describing in detail various embodiments thereof with reference to the attached drawings in which.

DETAILED DESCRIPTION

Figure 1:
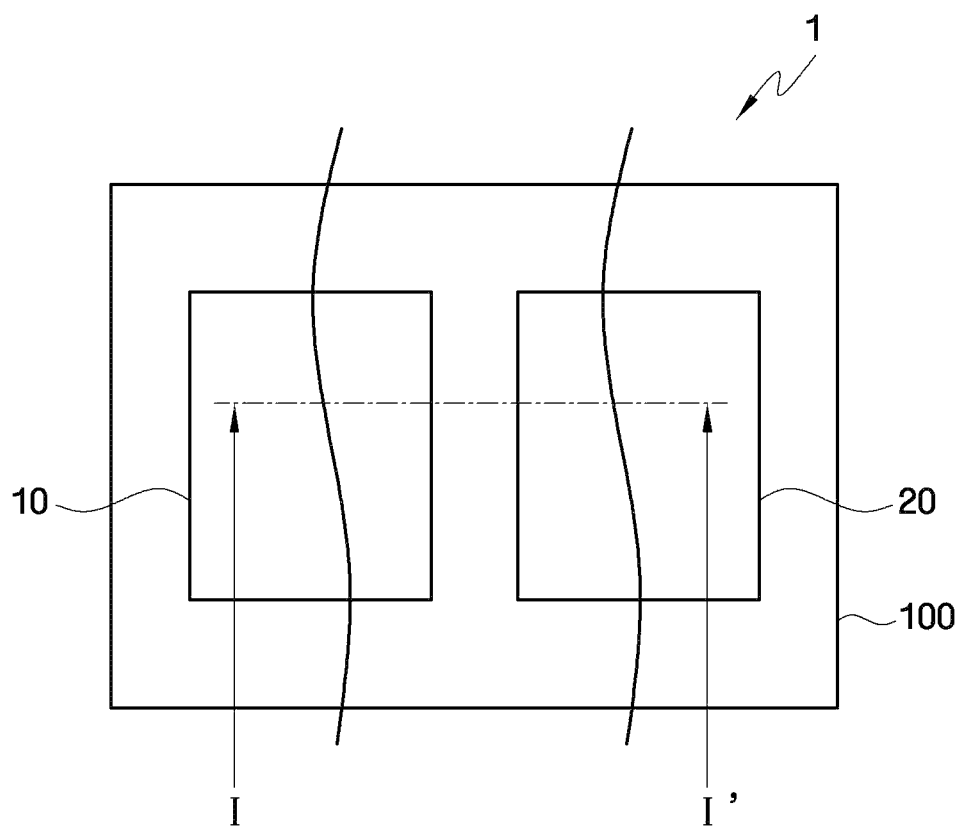
FIG. 1 is a plan view of a semiconductor device according to exemplary embodiments.

Various example embodiments will be described more fully with reference to the accompanying drawings, in which embodiments are shown. The present invention may, however, be embodied in many different forms and should not be construed as being limited to the embodiments set forth herein. In the drawings, the thickness of layers and regions are exaggerated for clarity.

As used herein, the term "and/or" includes any and all combinations of one or more of the associated listed items.

The terminology used herein is for the purpose of describing particular embodiments and is not intended to be limiting of the invention. As used herein, the singular forms are intended to include the plural forms as well, unless the context clearly indicates otherwise. It will be further understood that the terms such as "comprises," "includes," and/or "made of," when used in this specification, specify the presence of stated elements, steps, operations, and/or components, but do not preclude the presence or addition of one or more other elements, steps, operations, and/or components.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure.

Embodiments described herein will be described referring to plan views and/or cross-sectional views by way of ideal schematic views of the invention. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures have schematic properties, and shapes of regions shown in figures exemplify specific shapes of regions of elements and are not intended to limit aspects of the invention.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "planar," or "coplanar," as used herein when referring to orientation, location, shapes, sizes, amounts, or other measures do not necessarily mean an exactly identical orientation, location, shape, size, amount, or other measure, but are intended to encompass nearly identical orientation, location, shapes, sizes, amounts, or other measures within acceptable variations that may occur, for example, due to manufacturing processes.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2:
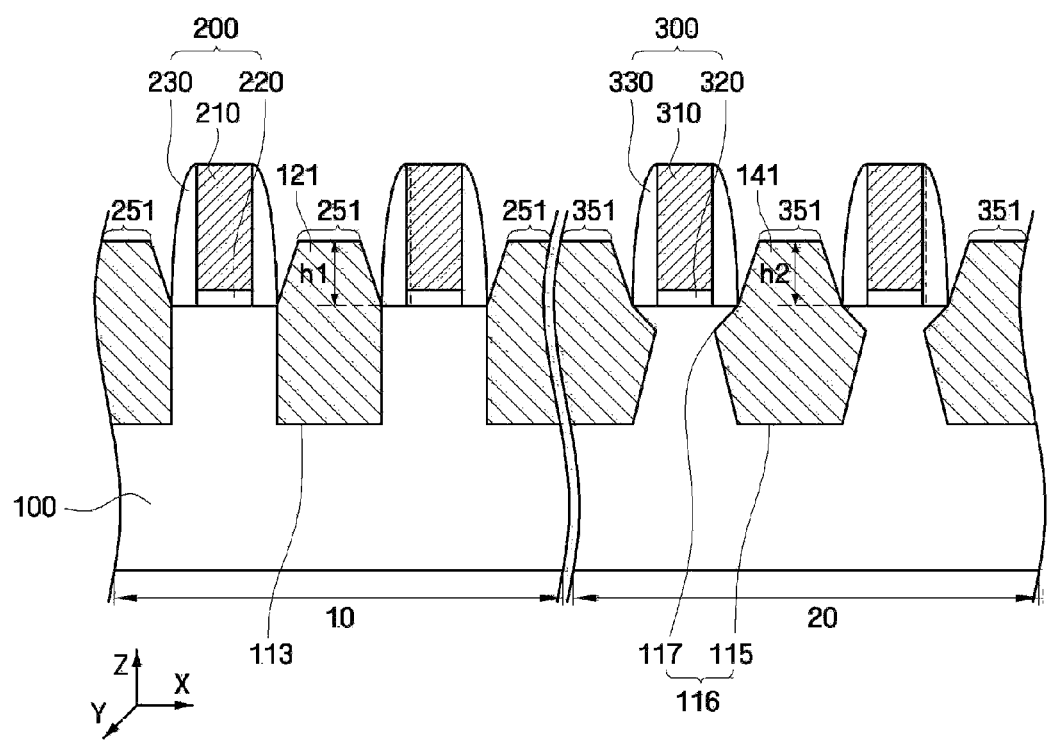
FIG. 2 is a cross-sectional view of a semiconductor device according to an embodiment, taken along the line I-I' of FIG. 1.

A semiconductor device according to example embodiments will be described with reference to FIGS. 1 and 2. FIG. 1 is a plan view of a semiconductor device according to exemplary embodiments, and FIG. 2 is a cross-sectional view of a semiconductor device according to example embodiments, taken along the line I-I' of FIG. 1.

Hereinafter, a semiconductor device according to exemplary embodiments will be described with reference to FIGS. 1 to 13.

Referring to FIG. 1, the semiconductor device 1 may include a first semiconductor device region 10 and a second semiconductor device region 20 defined in a semiconductor substrate 100.

The semiconductor substrate 100 may be, for example, a silicon substrate, SOI (Silicon On Insulator) substrate, a gallium arsenic substrate, or a silicon germanium substrate. Also, the semiconductor substrate 100 may be of a first conductivity type or a second conductivity type. For example, the semiconductor substrate 100 may have a p- or n-type conductivity.

The first semiconductor device region 10 and the second semiconductor device region 20 may be regions where semiconductor circuits performing different functions are integrated. For example, in one embodiment, the first semiconductor device region 10 may be one of a DRAM, an SRAM or an EEPROM region that functions as a memory, and the second semiconductor device region 20 may be a region including logic-embedded circuits or a central processing unit. However, the regions 10 and 20 are not limited to these examples.

Semiconductor device 1 may be, for example, a semiconductor chip fabricated from a wafer and including different device regions, such as region 10 and region 20, that have different functions, such as a memory region and a control logic region. However, the semiconductor device described herein is not limited to a chip, and the regions do not need to have separate functions. In addition, the semiconductor device described herein may be included in, for example, embedded logic memory, a memory card, or may be connected to a board within a device, such as a cell phone, PDA, camera, laptop, etc.

FIG. 2 is a cross-sectional view of a semiconductor device according to an exemplary embodiment, taken along the line I-I' of FIG. 1.

Referring to FIG. 2, a first gate structure 200 extending along a direction between a top surface and a bottom surface of substrate 100 (i.e., Z-direction) may be positioned in the first semiconductor device region 10. In addition, a second gate structure 300 extending along the Z-direction spaced apart from the first gate structure 200 in a direction perpendicular to the Z-direction (i.e., X-direction) may be positioned in the second semiconductor device region 20. The first and second gate structures 200 and 300 may include gate insulation layers 220 and 320, gate electrodes 210 and 310, and spacers 230 and 330.

In one embodiment, the gate insulation layers 220 and 320 are positioned on the semiconductor substrate 100. The gate insulation layers 220 and 320 are formed for the purpose of insulating an active region formed in the semiconductor substrate 100 from the gate electrodes 210 and 310. The gate insulation layers 220 and 320 may be formed, for example, of thermal oxide or silicon oxide ($SiO_x$), and examples thereof may include FOX (Flowable Oxide), TOSZ (Tonen Silazene), USG (Undoped Silicate Glass), BSG (Boro Silicate Glass), PSG (Phospho Silicate Glass), BPSG (Boro Phospho Silicate Glass), PE-TEOS (Plasma Enhanced Tetra Ethyl Ortho Silicate), FSG (Fluoride Silicate Glass), HDP (high density plasma), and so on.

The gate electrodes 210 and 310 are positioned on the gate insulation layers 220 and 320. The gate electrodes 210 and 310 may include conductive materials, such as, for example, poly-Si, poly-SiGe, a metal such as Ta, TaN, TaSiN, TiN, Mo, Ru, Ni, or NiSi, or combination thereof.

The spacers 230 and 330 may be positioned at opposite sides of the gate insulation layers 220 and 320 and the gate electrodes 210 and 310. The spacers 230 and 330 may include, for example, a nitride film or an oxide film.

In one embodiment, a first trench 113 is formed adjacent to a first side of the first gate structure 200 in the X-direction. In one embodiment, the first trench 113 may extend from a top surface toward a bottom surface of the semiconductor substrate 100. The first trench 113 may be disposed between two gate structures in the X-direction, such that each gate structure may have two sides, each side being adjacent to a trench in the X-direction.

Source and/or drain regions 251 forming part of an MOS transistor may be formed in the first trench 113. For example, a source region may be in a first trench adjacent to one side of a gate structure, and a drain region may be in a second trench adjacent to a second side of the gate structure. To this end, a first semiconductor pattern 121 including a doped epitaxial layer in the first trench 113 may be formed in the first region 10. Here, the first semiconductor pattern 121 may have a lattice constant different from that of the semiconductor substrate 100. More specifically, when an MOS transistor formed in the first semiconductor device region 10 is a p-type MOS (PMOS) transistor, the first semiconductor pattern 121 may be made of a semiconductor substance having a lattice constant greater than that of a semiconductor substance forming the semiconductor substrate 100. For example, when the semiconductor substrate 100 is made of silicon (Si), the first semiconductor pattern 121 may include silicon-germanium (SiGe) having a greater lattice constant than silicon (Si). Accordingly, compressive stress may be applied to a channel region below the first gate structure 200, thereby improving the mobility of the PMOS transistor. In this case, an element of Group 3 in the periodic table may be doped into the first semiconductor pattern 121. For example, when the first semiconductor pattern 121 includes silicon-germanium (SiGe), boron (B), gallium (Ga) or indium (In) may be doped into silicon-germanium (SiGe).

When a MOS transistor formed in the first semiconductor device region 10 is an n-type MOS (NMOS) transistor, the first semiconductor pattern 121 may be made of a semiconductor substance having a lattice constant smaller than that of a semiconductor substance forming the semiconductor substrate 100. For example, when the semiconductor substrate 100 is made of silicon (Si), the first semiconductor pattern 121 may include silicon-carbon (SiC) having a smaller lattice constant than silicon (Si). Accordingly, compressive stress may be applied to a channel region below the first gate structure 200, thereby improving the mobility of the NMOS transistor. In this case, an element of Group 5 in the periodic table may be doped into the first semiconductor pattern 121. For example, when the first semiconductor pattern 121 includes silicon-germanium (SiGe), nitrogen (N), phosphorus (P) or arsenic (As) may be doped into silicon-carbon (SiC).

In one embodiment, a second trench 116 is formed spaced apart from the first trench 113 in the X-direction. The second trench 116 may be adjacent to one side of the second gate structure 300 of the second semiconductor device region 20, and may be between two gate structures of the second semiconductor device region 20. The second trench 116 may include a portion 115 indented from the top surface toward the bottom surface of the semiconductor substrate 100, and may also include a recess region 117 overlapping in the X-direction with a portion of the second gate structure 300 (e.g., a lower portion).

Source and/or drain regions 351 forming part of an MOS transistor may be formed in the second trench 116. For example, a source region may be in a first trench adjacent to one side of a gate structure, and a drain region may be in a second trench adjacent to a second side of the gate structure. To this end, a second semiconductor pattern 141 including a doped epitaxial layer in the second trench 116 may be formed in the second region 20. The second semiconductor pattern 141 may have a lattice constant different from that of the semiconductor substrate 100. More specifically, when a MOS transistor formed in the second semiconductor device region 20 is a p-type MOS (PMOS) transistor, the second semiconductor pattern 141 may be made of a semiconductor substance having a lattice constant greater than that of a semiconductor substance forming the semiconductor substrate 100. For example, when the semiconductor substrate 100 is made of silicon (Si), the second semiconductor pattern 141 may include silicon-germanium (SiGe) having a greater lattice constant than silicon (Si). Accordingly, compressive stress may be applied to a channel region below the second gate structure 200, thereby improving the mobility of the PMOS transistor. In this case, an element of Group 3 in the periodic table may be doped into the second semiconductor pattern 141. For example, when the second semiconductor pattern 141 includes silicon-germanium (SiGe), boron (B), gallium (Ga) or indium (In) may be doped into silicon-germanium (SiGe).

When a MOS transistor formed in the second semiconductor device region 20 is an n-type MOS (NMOS) transistor, the second semiconductor pattern 141 may be made of a semiconductor substance having a lattice constant smaller than that of a semiconductor substance forming the semiconductor substrate 100. For example, when the semiconductor substrate 100 is made of silicon (Si), the second semiconductor pattern 141 may include silicon-carbon (SiC) having a smaller lattice constant than silicon (Si). Accordingly, compressive stress may be applied to a channel region below the second gate structure 300, thereby improving the mobility of the NMOS transistor. In this case, an element of Group 5 in the periodic table may be doped into the second semiconductor pattern 141. For example, when the second semiconductor pattern 141 includes silicon-germanium (SiGe), nitrogen (N), phosphorus (P) or arsenic (As) may be doped into silicon-carbon (SiC).

In one embodiment, unlike the first trench 113, the second trench 116 includes a recess region 117, thereby improving the mobility of the MOS transistor formed by the second semiconductor device region 20. Accordingly, the first trench 113 formed in the first semiconductor device region 10 and the second trench 116 formed in the second semiconductor device region 20 may have different shapes. In particular, cross-sectional shapes of the first and second trenches 113 and 116 may be different from each other, when viewed from a third direction perpendicular to the Z and X directions (i.e., Y-direction).

For example, the first trench 113 may be formed not to include a recess region, and the second trench 116 may be formed to include the recess region 117, which may be determined according to the functions of semiconductor elements formed in the first semiconductor device region 10 and the second semiconductor device region 20. For example, when the first semiconductor device region 10 is a region where memory circuits (e.g. DRAMs, SRAMs or EEPROMs etc.) are integrated, it would be beneficial to form MOS transistors capable of easily controlling the off current, rather than the mobility. In this case, the first trench 113 formed in the first semiconductor device region 10 may not need a recess region to improve the mobility of the MOS transistor.

However, when the second semiconductor device region 20 is a region where logic-embedded circuits are integrated, it would be beneficial to form MOS transistors having high mobility, rather than MOS transistors capable of easily controlling the off current. In this case, the second trench 116 formed in the second semiconductor device region 20 may benefit from the recess region 117 to improve the mobility of the MOS transistor. For example, the second trench 116 including the recess region 117 may have a sigma (Σ) shape. Accordingly, cross-sectional shapes of the first trench 113 and the second trench 116 may be different as a whole.

A distance h1 from a top surface of the semiconductor substrate 100 to a top surface of the first semiconductor pattern 121 may be the same as a distance h2 from the top surface of the semiconductor substrate 100 to a top surface of the second semiconductor pattern 141. In addition, a cross-sectional shape of the first pattern 121 above the top surface of the substrate 100 may be the same as a cross-sectional shape of the second pattern 141 above the top surface of the substrate 100. In one embodiment, however, the cross-sectional shapes of the first and second semiconductor patterns 121 and 141 below the top surface of the substrate 100 are different.

In one embodiment, the top surfaces of the first semiconductor pattern 121 and the second semiconductor pattern 141 rising from the first trench 113 and the second trench 116 may be coplanar.

Next, a semiconductor device according to another embodiment will be described with reference to FIGS. 1 and 3.

Figure 3:
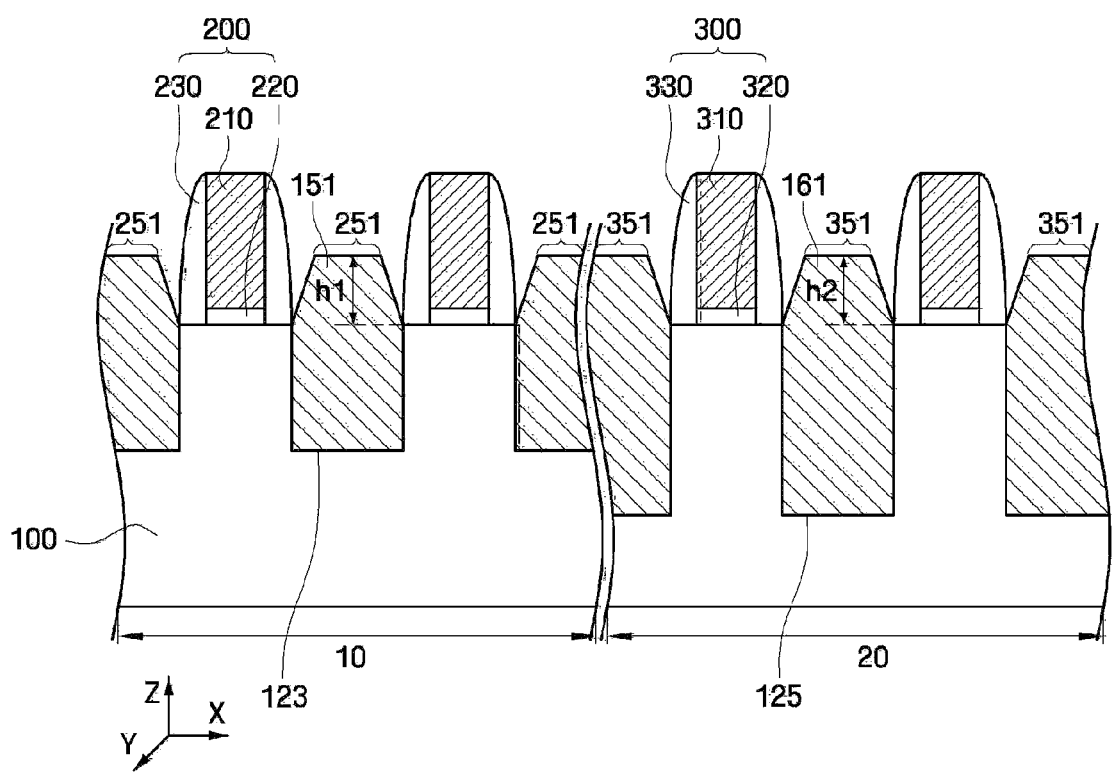
FIG. 3 is a cross-sectional view of a semiconductor device according to example embodiments, taken along the line I-I' of FIG. 1.

FIG. 3 is a cross-sectional view of a semiconductor device according to example embodiments, taken along the line I-I' of FIG. 1.

For convenience of explanation, the same functional components as those shown in FIGS. 1 and 2 are denoted by the same reference numerals, and a description thereof will not be given.

Referring to FIG. 3, the semiconductor device 1 may include a first trench 123 and a second trench 125 having different cross-sectional shapes. More specifically, a depth of the first trench 123 formed in a first semiconductor device region 10 may be less than a depth of the second trench 125 formed in a second semiconductor device region 20. In this case, a ratio of an area of the first trench 123 or an area of a group of first trenches 123 formed in a first semiconductor device region 10 to the entire area of the first semiconductor device region 10 is greater than a ratio of an area of the second trench 125 or an area of a group of second trenches 125 formed in the second semiconductor device region 20 to the entire area of the second semiconductor device region 20. That is, an open ratio of the first semiconductor device region 10 is larger than that of the second semiconductor device region 20. Here, the open ratio means a ratio of an area of a semiconductor pattern forming region, which is formed by epitaxially growing a semiconductor substance, to an area of a device forming region.

Accordingly, a distance h1 from a top surface of a semiconductor substrate 100 to a top surface of a first semiconductor pattern 151 may be the same as a distance h2 from the top surface of the semiconductor substrate 100 to a top surface of a second semiconductor pattern 161. That is, even if the second trench 125 is deeper than the first trench 123, since the open ratio of the second trench 125 formed in the second semiconductor device region 20 is smaller than that of the first trench 123 formed in the first semiconductor device region 10, top surfaces of the first semiconductor pattern 151 and the second semiconductor pattern 161 respectively rising from the first trench 123 and the second trench 125 may be coplanar. As in the example of FIG. 2, a cross-sectional shape of the first pattern 151 above the top surface of the substrate 100 may be the same as a cross-sectional shape of the second pattern 161 above the top surface of the substrate 100. In one embodiment, however, the cross-sectional shapes of the first and second semiconductor patterns 151 and 161 below the top surface of the substrate 100 are different.

Figure 4:
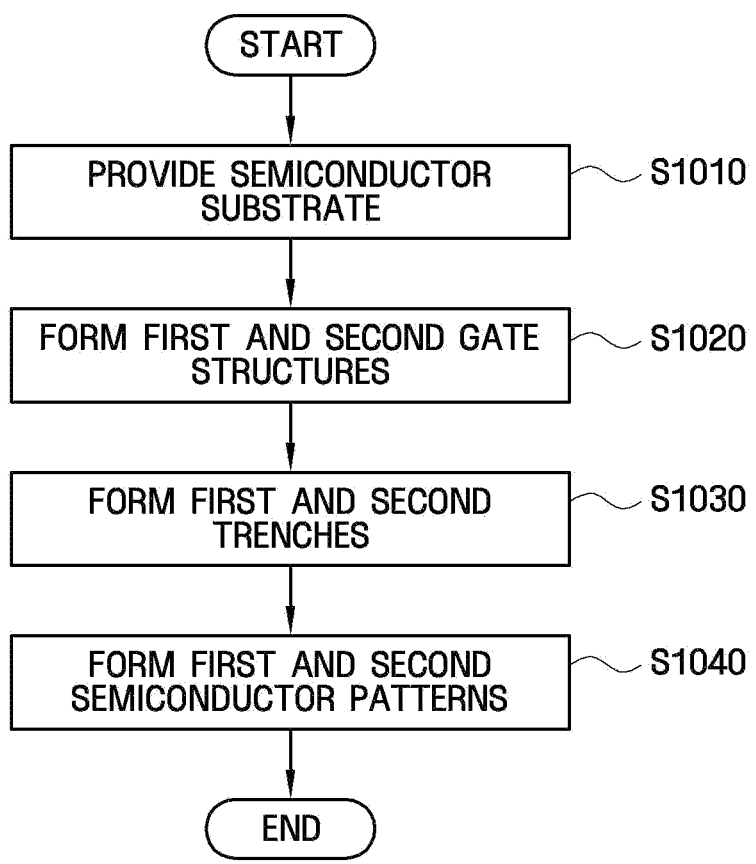
FIG. 4 is a flow chart illustrating a fabricating method of a semiconductor device according to example embodiments.

Next, a method of fabricating a semiconductor device according to exemplary embodiments will be described with reference to FIGS. 1, 2 and 4 to 11. FIG. 4 is a flow chart illustrating a method of fabricating a semiconductor device according to exemplary embodiments, and FIGS. 5 to 11 are cross-sectional views illustrating processing steps in a semiconductor device according to example embodiments. For convenience of explanation, the same functional components as those shown in FIGS. 1 to 3 are denoted by the same reference numerals, and a description thereof will not be given.

Figure 5:
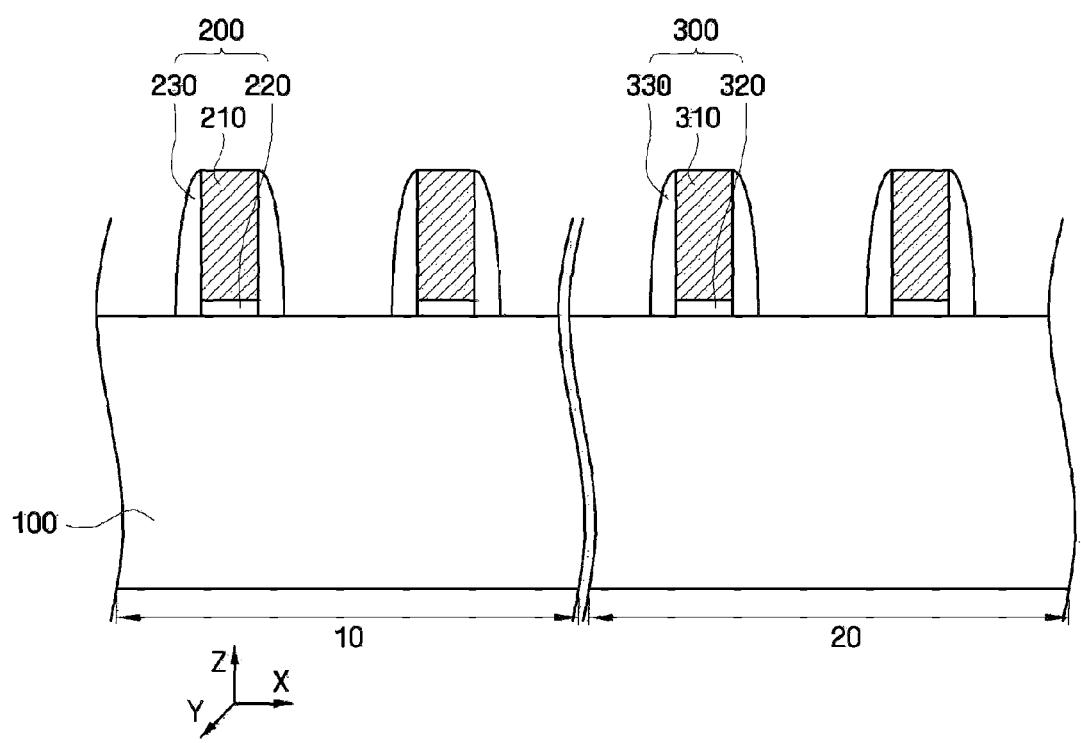
FIGS. 5 to 11 are cross-sectional views illustrating processing steps in a semiconductor device according to example embodiments.

First, referring to FIGS. 1, 4 and 5, the semiconductor substrate 100 is provided (S1010). For example, the semiconductor substrate 100 may have the first semiconductor device region 10 and the second semiconductor device region 20 defined therein, as discussed above.

The semiconductor substrate 100 may be, for example, a silicon (Si) substrate.

A layer (not shown) for forming gate insulation layers 220 and 320 may be formed on the semiconductor substrate 100. For example, in one embodiment, the layer for forming the gate insulation layers 220 and 320 is formed on the entire surface of the semiconductor substrate 100 using, for example, silicon oxide (SiOx), by a chemical vapor deposition (CVD) process. In addition, a layer (not shown) for forming gate electrodes 210 and 310 may be formed on a gate insulation layer using, for example, polysilicon (p-Si), by a chemical vapor deposition (CVD) process.

Next, the layer for forming the gate insulation layers 220 and 320 and the layer for forming the gate electrodes 210 and 310 are etched; thereby forming gate insulation layers 220 and 320 and gate electrodes 210 and 310.

Next, a spacer forming layer (not shown) may be formed to cover the gate insulation layers 220 and 320 and the gate electrodes 210 and 310. In one embodiment, the spacer forming layer is formed on a gate insulation layer using, for example, silicon oxide (SiOx), by a chemical vapor deposition (CVD) process.

Thereafter, the spacer forming layer is etched back to form spacers 230 and 330 on both sidewalls of the gate insulation layers 220 and 320 and the gate electrodes 210 and 310. Accordingly, the first gate structure 200 and the second gate structure 300 are formed in the first semiconductor device region 10 and the second semiconductor device region 20 of the semiconductor substrate 100, respectively (S1020).

Figure 6:
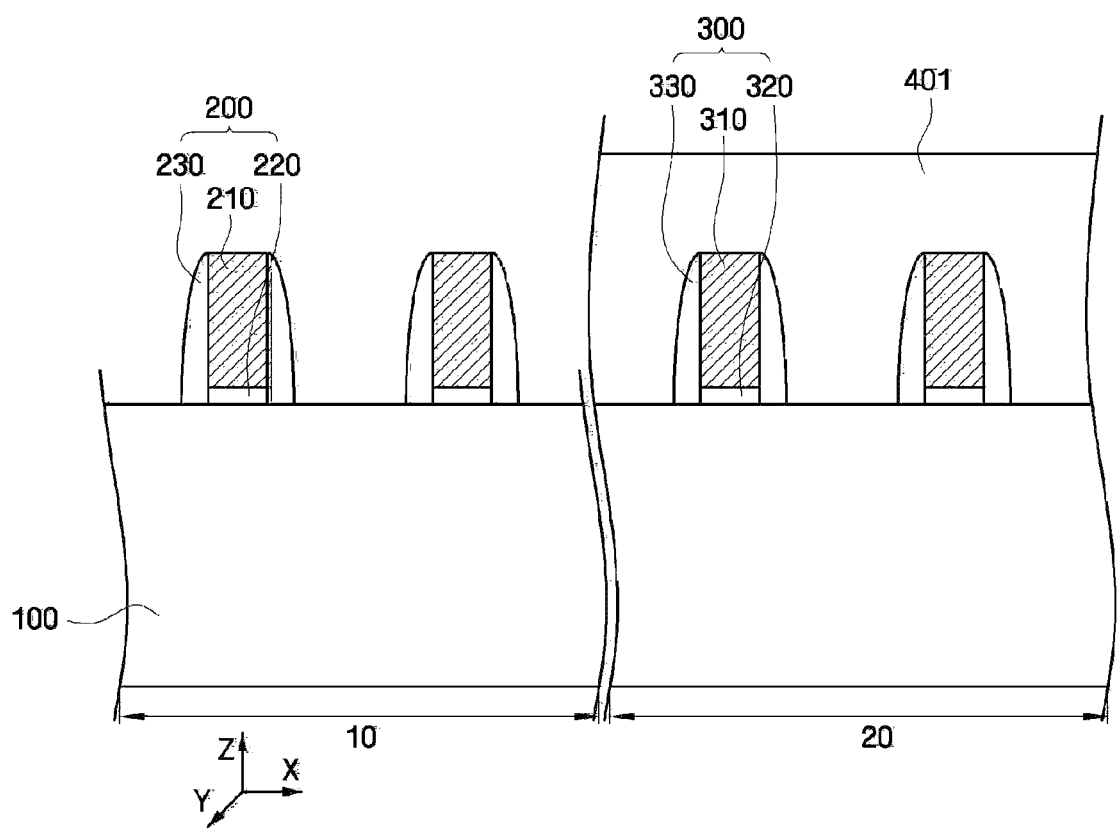

Referring to FIG. 6, in one embodiment, a mask forming layer (not shown) is formed on the resultant product of FIG. 5. The mask forming layer may be formed on the entire surface of the semiconductor substrate 100 using, for example, silicon oxide (SiOx), by a chemical vapor deposition (CVD) process. Accordingly, the first gate structure 200 and the second gate structure 300 are covered by the mask forming layer. Thereafter, the mask forming layer formed on the first semiconductor device region 10 is removed to expose the first semiconductor device region 10 and the first gate structure 200. Accordingly, a mask layer 401 covering the second semiconductor device region 20 and the second gate structure 300 is formed. When the first trench 113 is formed in the first semiconductor device region 10 using the mask layer 401 in a subsequent process, the semiconductor substrate 100 of the second semiconductor device region 20 may not be etched.

Figure 7:
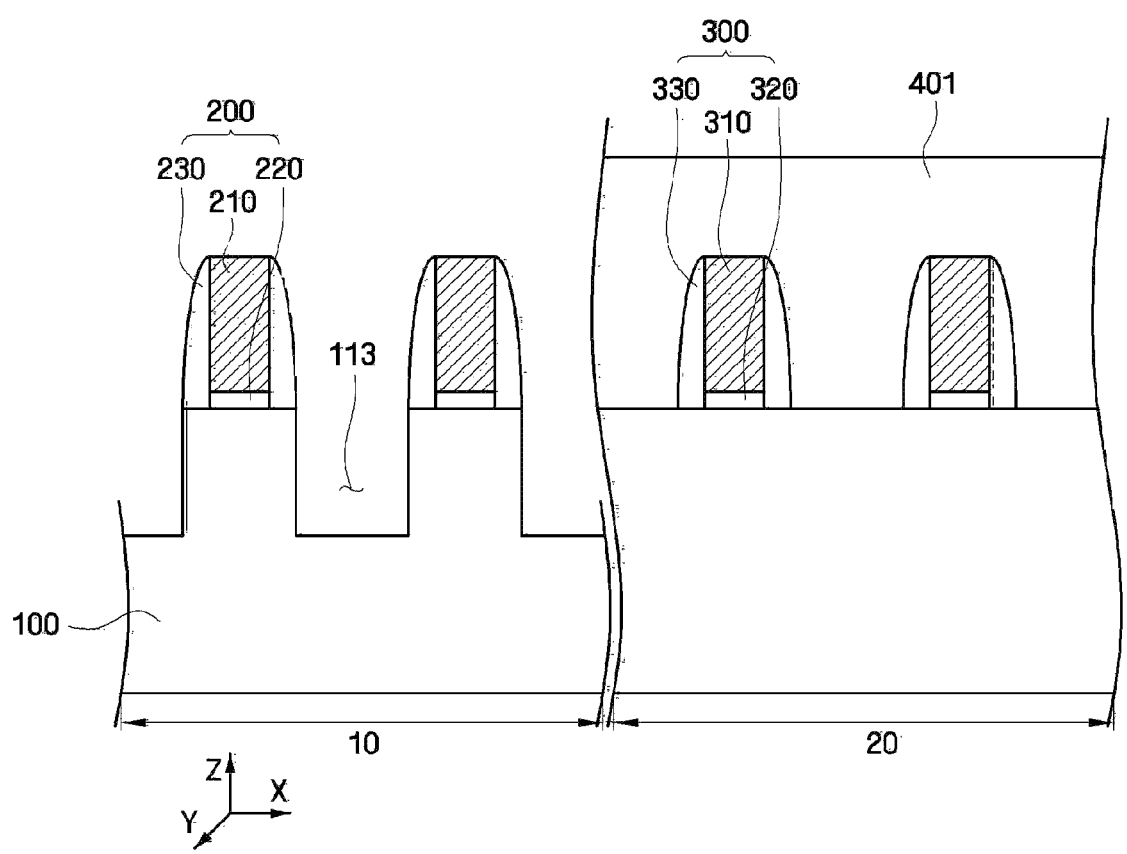

Referring to FIG. 7, the first trench 113 is formed by etching the semiconductor substrate 100 of the first semiconductor device region 10 without the mask layer 401. The etching of the semiconductor substrate 100 may be performed, for example, by dry etching or wet etching. Here, the first trench 113 may be formed on the semiconductor substrate 100 adjacent to one side of the first gate structure 200, and adjacent to a side of a second gate structure. As such, the trench may be disposed between two gate structures in an X-direction, and each gate structure may be disposed between two trenches in the X-direction.

Figure 8:
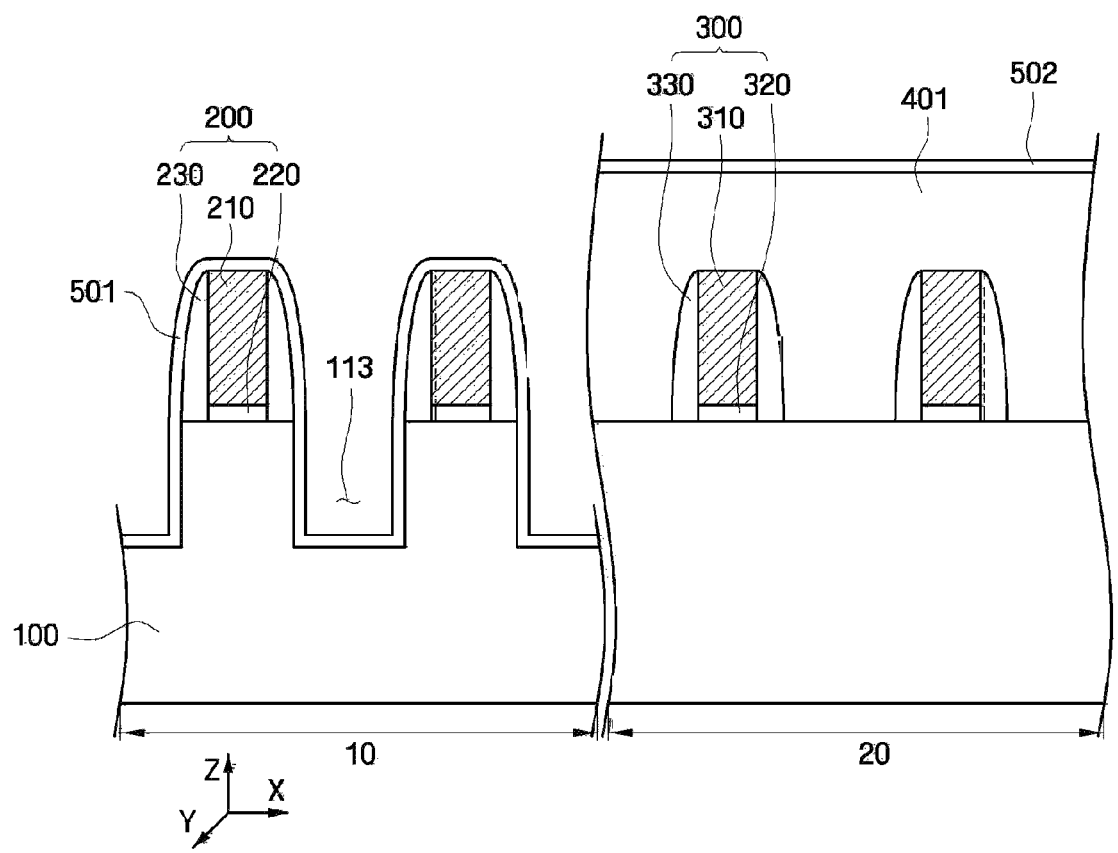

Referring to FIG. 8, a first etch stop layer 501 and a second etch stop layer 502 are formed on the resultant product of FIG. 7.

For example, the first etch stop layer 501 may be continuously conformally formed on the first gate structure and walls of the first trench 113. In addition, the second etch stop layer 502 may be continuously conformally formed on the mask layer 401. The first etch stop layer 501 and the second etch stop layer 502 may be interconnected to or disconnected from each other.

The first and second etch stop layers 501 and 502 may be formed using, for example, silicon nitride (SiN), by a chemical vapor deposition (CVD) process or an atomic layer deposition (ALD) process.

Figure 9:
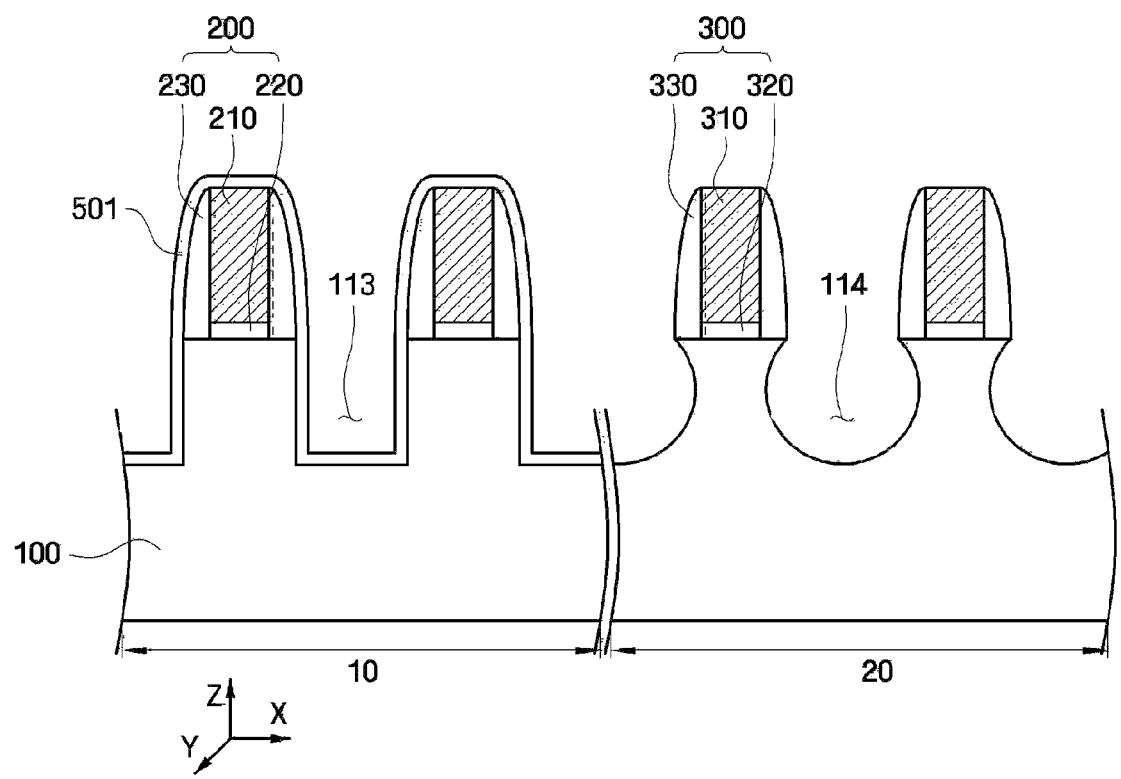

Referring to FIG. 9, the second etch stop layer 502 and the mask layer 401 positioned in the second semiconductor device region 20 are sequentially removed. Accordingly, the top surface of the semiconductor substrate 100 between the second gate structures 300 in the second semiconductor device region 20 is exposed. To remove the second etch stop layer 502 and the mask layer 401, a mask pattern (not shown) may be formed to cover the first etch stop layer 501.

Thereafter, a preliminary trench 114 is formed in the semiconductor substrate 100 by etching the exposed semiconductor substrate 100 from the second semiconductor device region 20. The preliminary trench 114 may be formed by dry etching the semiconductor substrate 100. The preliminary trench 114 may be formed in the semiconductor substrate 100 in opposite sides of the second gate structure 300.

Here, the first etch stop layer 501 is formed on the first gate structure 200 and walls of the first trench 113 in the first semiconductor device region 10, thereby preventing the semiconductor substrate 100 in the first semiconductor device region 10 from being etched.

Figure 10:
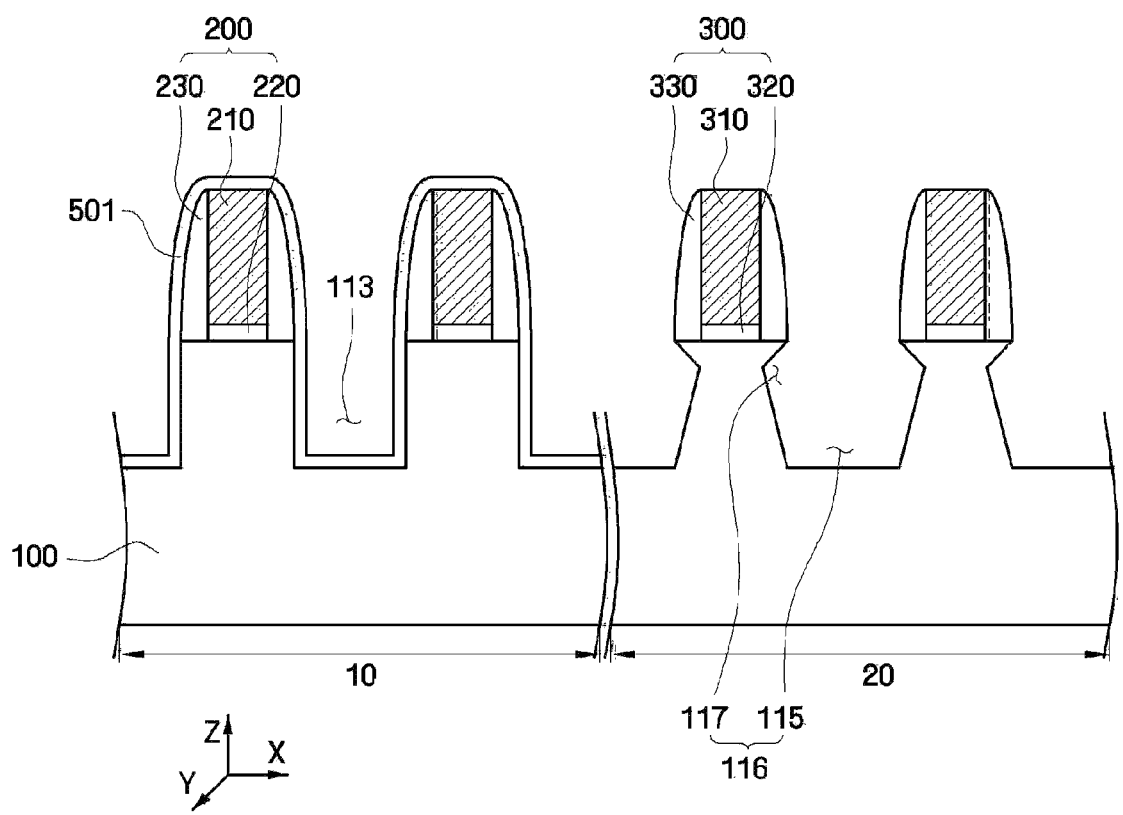

Referring to FIG. 10, the second trench 116 is formed by wet etching the preliminary trench 114. Here, the sidewalls and bottom surface forming the preliminary trench 114 may be etched by performing a wet etching process using, for example, $NH_4OH$ or TMAH solution.

The second trench 116 may include a portion 115 downwardly recessed from the top surface of the semiconductor substrate 100 and a recess region 117 partially etched from the sidewalls of the indentation 115 to a lower portion of the second gate structure 300 in an X-direction. Here, the recess region 117 that may overlap with the second gate structure 300 may be disposed below the gate structure.

Figure 11:
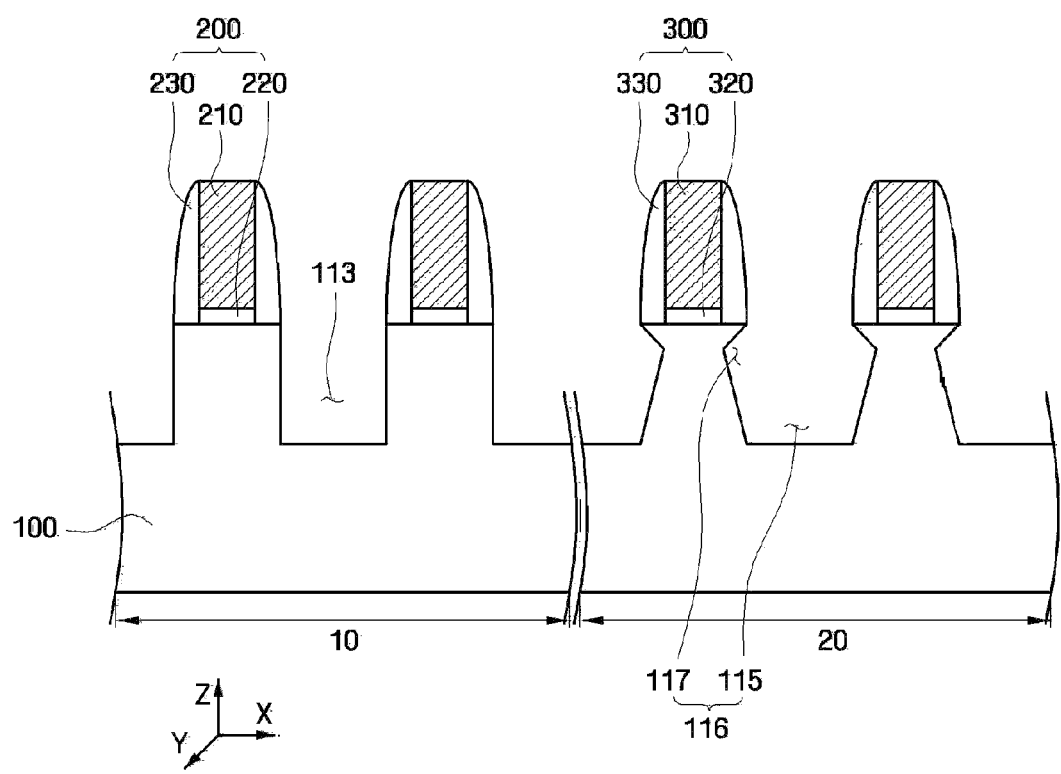

Referring to FIG. 11, the first etch stop layer 501 formed on the first gate structure 200 and walls of the first trench 113 in the first semiconductor device region 10 is removed, thereby exposing the first trench 113 to the outside. The etch stop layer 501 may be removed using, for example, phosphoric acid. Through the above-described process, the first and second trenches 113 and 116 are formed (S1030).

Referring to FIG. 2, first and second semiconductor patterns 121 and 141 are then formed in the first and second trenches 113 and 116, respectively (S1040).

In one embodiment, the first and second semiconductor patterns 121 and 141 may be formed by epitaxially growing a semiconductor substance, which will now be described in detail.

In a case where the MOS transistor formed in the first and second semiconductor device regions 10 and 20 is a p-type MOS (PMOS) transistor, the first and second semiconductor patterns 121 and 141 may be made of a semiconductor substance having a lattice constant greater than that of a semiconductor substance forming the semiconductor substrate 100. For example, when the semiconductor substrate 100 is made of silicon (Si), the first and second semiconductor patterns 121 and 141 are formed by epitaxially growing silicon-germanium (SiGe) having a greater lattice constant than silicon (Si). The first and second semiconductor patterns 121 and 141 may be formed by epitaxially growing silicon-germanium (SiGe) containing boron (B) using, for example, dichlorosilane ($Si_2H_2Cl_2$), diborane ($B_2H_6$), hydrogen chloride (HCl), or hydrogen ($H_2$), at 600° C.~800° C. That is, an epitaxial layer including silicon-germanium (SiGe) doped with an element of Group 3 in the periodic table is formed to serve as source and drain regions 251 and 351.

In a case where the MOS transistor formed in the first and second semiconductor device regions 10 and 20 is an n-type MOS (NMOS) transistor, the first and second semiconductor patterns 121 and 141 may be made of a semiconductor substance having a lattice constant greater than that of a semiconductor substance forming the semiconductor substrate 100. For example, when the semiconductor substrate 100 is made of silicon (Si), the first and second semiconductor patterns 121 and 141 are formed by epitaxially growing silicon-carbon (SiC) having a smaller lattice constant than silicon (Si). The first and second semiconductor patterns 121 and 141 may be formed by epitaxially growing silicon-carbon (SiC) containing phosphorus (P) using, for example, silane ($SiH_4$), propane ($C_3H_6$), phosphine ($PH_3$), or hydrogen chloride (HCl), at 600° C.~800° C. That is to say, an epitaxial layer including silicon-carbon (SiC) doped with an element of Group 5 in the periodic table is formed to serve as source and drain regions 251 and 351.

Figure 12:
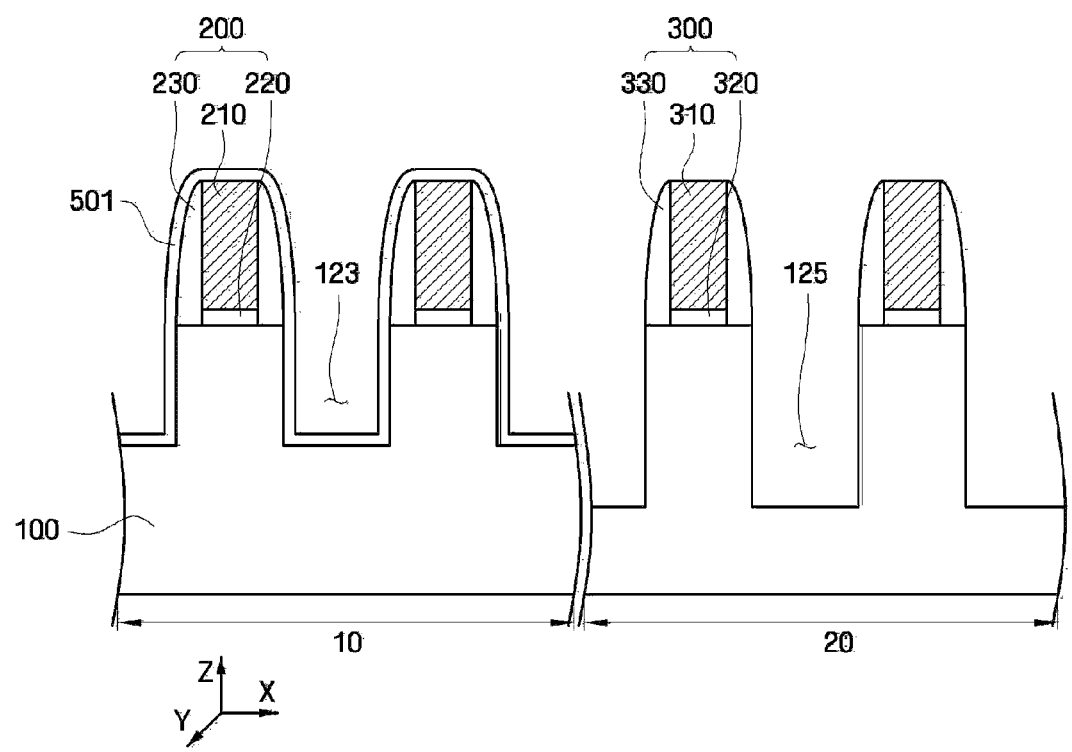
FIGS. 12 and 13 are cross-sectional views illustrating processing steps in a semiconductor device according to example embodiments.
Figure 13:
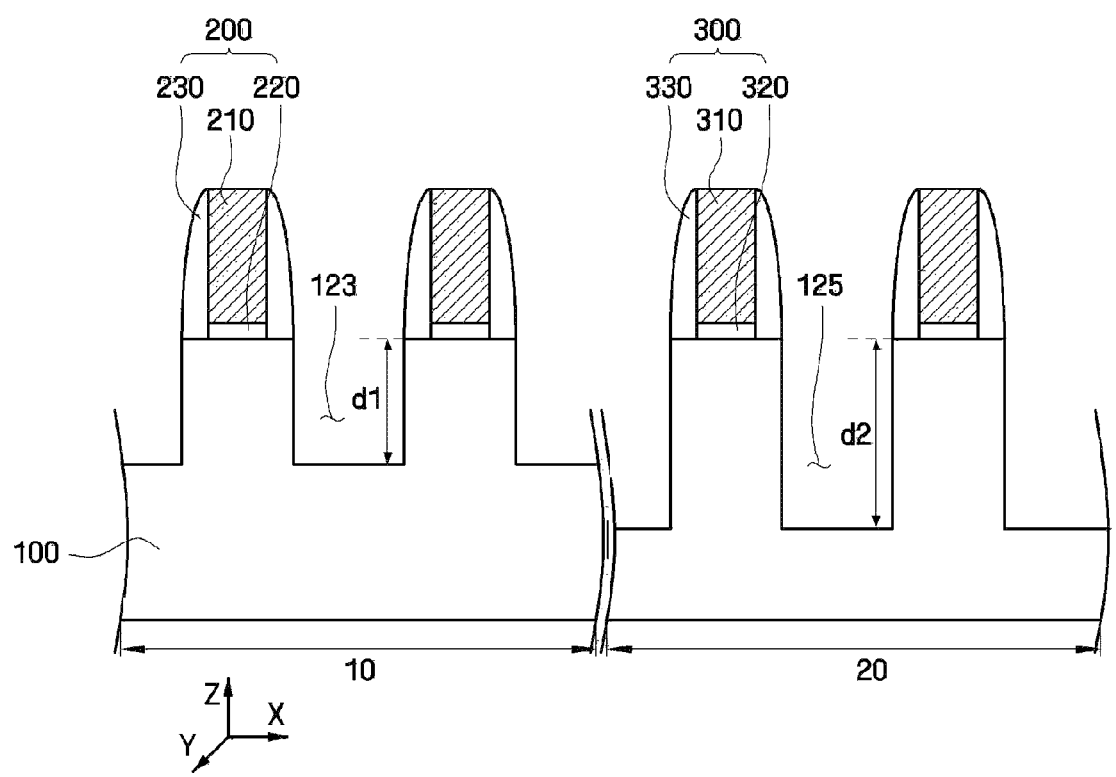

Next, a method of fabricating a semiconductor device according to another embodiment will be described with reference to FIGS. 1, 3, 4, 8 and 12 to 13. FIGS. 12 and 13 are cross-sectional views illustrating processing steps in a method of fabricating a semiconductor device according to another embodiment.

For convenience of explanation, the same functional components as those of the previous embodiment are denoted by the same reference numerals, and a description thereof will not be given.

Referring to FIG. 12, the second etch stop layer 502 and the mask layer 401 positioned in the second semiconductor device region 20 are sequentially removed from the resultant structure shown in FIG. 8. Accordingly, the top surface of the semiconductor substrate 100 between the second gate structures 300 in the second semiconductor device region 20 is exposed. To remove the second etch stop layer 502 and the mask layer 401, a mask pattern (not shown) may be formed to cover the first etch stop layer 501.

Thereafter, a second trench 125 is formed in the semiconductor substrate 100 by etching the exposed semiconductor substrate 100 from the second semiconductor device region 20. The second trench 125 may be formed by dry etching or wet etching the semiconductor substrate 100. The second trench 125 may be formed in the semiconductor substrate 100 adjacent to sides of the second gate structures 300.

As shown, the first etch stop layer 501 is formed on the first gate structure 200 and walls of the first trench 113 in the first semiconductor device region 10, thereby preventing the semiconductor substrate 100 in the first semiconductor device region 10 from being etched. Since the first trench 123 is formed in the same manner as the first trench 113 of the previous embodiment, a repeated description will not be given.

Referring to FIG. 13, the first etch stop layer 501 formed on the first gate structure 200 and walls of the first trench 113 in the first semiconductor device region 10 is removed, thereby exposing the first trench 123 to the outside. The etch stop layer 501 may be removed using, for example, phosphoric acid. Through the above-described process, the first and second trenches 123 and 125 are formed.

In one embodiment, a ratio of an area of the first trench 123 or a group of the first trenches 123 formed in the first semiconductor device region 10 to an entire area of the first semiconductor device region 10 is greater than a ratio of an area of the second trench 125 or a group of the second trenches 125 to an entire area of the second semiconductor device region 20, and a depth d2 of the second trench 125 is greater than a depth d1 of the first trench 123.

That is, an open ratio of the first semiconductor device region 10 may be larger than that of the second semiconductor device region 20. Here, the open ratio refers to a ratio of an area of a semiconductor pattern forming region, which is formed by epitaxially growing a semiconductor substance, to an area of a device forming region.

Referring to FIG. 3, the first and second semiconductor patterns 151 and 161 are then formed in the first and second trenches 123 and 125. Since the first and second semiconductor patterns 151 and 161 according to the embodiment of the present invention are formed in the same manner as the first and second semiconductor patterns 121 and 141 according to the previous embodiment, a repeated description thereof will not be given the first and second semiconductor patterns 151 and 161.

While the present disclosure has been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. A method of fabricating a semiconductor device, the method comprising:
providing a semiconductor substrate having a first semiconductor device region and a second semiconductor device region defined therein and including a bottom surface and a top surface;
forming a first gate structure in the first semiconductor device region;
forming a second gate structure in the second semiconductor device region, the second gate structure spaced apart from the first gate structure in a first direction, the first direction perpendicular to a second direction extending between the top surface and bottom surface;
forming a first trench adjacent to a first side of the first gate structure in the first direction;
forming a second trench adjacent to a first side of the second gate structure in the first direction; and
forming a first semiconductor pattern in the first trench and forming a second semiconductor pattern in the second trench,
wherein the first and second trenches have different cross-sectional shapes from each other, when viewed from a third direction perpendicular to the first and second directions.

2. The method of claim 1, further comprising, before the forming of the first trench, forming a mask layer to cover the second semiconductor device region.

3. The method of claim 2, further comprising, before the forming of the second trench, forming a first etch stop layer on the first gate structure and wall of the first trench, and forming a second etch stop layer on the mask layer.

4. The method of claim 3, wherein the forming of the second trench comprises removing the second etch stop layer and the mask layer, and then forming a preliminary trench by etching the semiconductor substrate of the second semiconductor device region.

5. The method of claim 4, further comprising etching the preliminary trench to form a recess region, wherein the recess region overlaps with the second gate structure in the first direction.

6. The fabricating method of claim 5, wherein a height from a top surface of the semiconductor substrate to a top surface of the first semiconductor pattern is equal to a height from the top surface of the semiconductor substrate to a top surface of the second semiconductor pattern.

7. The method of claim 3, wherein forming the second trench comprises removing the second etch stop layer and the mask layer and etching the semiconductor substrate of the second semiconductor device region, wherein the second trench is deeper than the first trench.

8. The method of claim 7, wherein a height from a top surface of the semiconductor substrate to a top surface of the first semiconductor pattern is equal to a height from the top surface of the semiconductor substrate to a top surface of the second semiconductor pattern.

9. The method of claim 1, wherein each of the forming of the first and second semiconductor patterns comprise epitaxial growing a semiconductor substance.

10. The method of claim 9, wherein each of the first and second semiconductor patterns include silicon-germanium (SiGe) or silicon-carbon (SiC).

11. The method of claim 10, wherein the silicon-germanium (SiGe) is doped with an element of Group III in the periodic table.

12. The method of claim 10, wherein the silicon-carbon (SiC) is doped with an element of Group V in the periodic table.

13. A method of fabricating a semiconductor device, the method comprising:
providing a semiconductor substrate having a first semiconductor device region and a second semiconductor device region defined therein;
forming a first gate structure in the first semiconductor device region;

forming a second gate structure in the second semiconductor device region;

forming a first trench adjacent to a first side of the first gate structure in a first direction;

forming a second trench adjacent to a first side of the second gate structure in the first direction, the second trench having a recess region overlapping with the second gate structure in the first direction; and forming a first semiconductor pattern in the first trench and forming a second semiconductor pattern in the second trench.

14. The method of claim 13, further comprising, before the forming of the first trench, forming a mask layer to cover the second semiconductor device region.

15. The method of claim 14, further comprising, before the forming of the second trench, forming a first etch stop layer on the first gate structure and wall of the first trench, and forming a second etch stop layer on the mask layer.

16. The method of claim 13, wherein the recess region that overlaps the second gate structure is disposed below the gate structure.

\* \* \* \* \*